United States Patent
Scheiper et al.

(10) Patent No.: US 8,916,433 B2
(45) Date of Patent: Dec. 23, 2014

(54) SUPERIOR INTEGRITY OF HIGH-K METAL GATE STACKS BY CAPPING STI REGIONS

(75) Inventors: Thilo Scheiper, Dresden (DE); Peter Baars, Dresden (DE); Sven Beyer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 140 days.

(21) Appl. No.: 13/406,869

(22) Filed: Feb. 28, 2012

(65) Prior Publication Data
US 2012/0223407 A1 Sep. 6, 2012

(30) Foreign Application Priority Data
Mar. 1, 2011 (DE) .......................... 10 2011 004 922

(51) Int. Cl.
| | | |
|---|---|---|
| H01L 21/8238 | (2006.01) | |
| H01L 21/336 | (2006.01) | |
| H01L 21/76 | (2006.01) | |
| H01L 21/461 | (2006.01) | |
| H01L 21/8234 | (2006.01) | |
| H01L 21/28 | (2006.01) | |
| H01L 29/49 | (2006.01) | |
| H01L 29/51 | (2006.01) | |
| H01L 29/78 | (2006.01) | |
| H01L 29/10 | (2006.01) | |
| H01L 21/762 | (2006.01) | |

(52) U.S. Cl.
CPC ... *H01L 21/823878* (2013.01); *H01L 21/823437* (2013.01); *H01L 21/823481* (2013.01); *H01L 21/823828* (2013.01); *H01L 21/28123* (2013.01); *H01L 29/4966* (2013.01); *H01L 29/513* (2013.01); *H01L 29/78* (2013.01); *H01L 29/1054* (2013.01); *H01L 21/76232* (2013.01); *H01L 21/823425* (2013.01); *H01L 29/7848* (2013.01)
USPC ........... 438/221; 438/296; 438/424; 438/435; 438/437; 438/692

(58) Field of Classification Search
USPC ................. 438/221, 296, 424, 435, 437, 692; 257/E21.431
See application file for complete search history.

(56) References Cited

U.S. PATENT DOCUMENTS

| | | | |
|---|---|---|---|
| 6,204,185 B1 * | 3/2001 | Hsu ............................... | 438/692 |
| 6,350,661 B2 * | 2/2002 | Lim et al. ...................... | 438/424 |

(Continued)

FOREIGN PATENT DOCUMENTS

DE 102009021489 A1 11/2010 ........... H01L 21/8234

OTHER PUBLICATIONS

Translation of Official Communication from German Patent Office for German Patent Application No. 10 2011 004 922.3 dated Jan. 9, 2012.

*Primary Examiner* — Charles Garber
*Assistant Examiner* — Ron Pompey
(74) *Attorney, Agent, or Firm* — Amerson Law Firm, PLLC (57) ABSTRACT

When forming high-k metal gate electrode structures in an early manufacturing stage, integrity of an encapsulation and, thus, integrity of sensitive gate materials may be improved by reducing the surface topography of the isolation regions. To this end, a dielectric cap layer of superior etch resistivity is provided in combination with the conventional silicon dioxide material.

22 Claims, 8 Drawing Sheets

(56) References Cited

U.S. PATENT DOCUMENTS

| | | |
|---|---|---|
| 6,403,482 B1 * | 6/2002 | Rovedo et al. ............... 438/689 |
| 6,586,814 B1 * | 7/2003 | Patel et al. .................. 438/296 |
| 6,653,194 B1 * | 11/2003 | Park ............................ 438/296 |
| 8,026,151 B2 * | 9/2011 | Ang ............................. 438/424 |
| 2001/0031540 A1 * | 10/2001 | Lim et al. .................... 438/424 |
| 2006/0278952 A1 * | 12/2006 | Mori et al. ................... 257/510 |
| 2009/0011584 A1 * | 1/2009 | Cho et al. .................... 438/589 |
| 2010/0289094 A1 | 11/2010 | Reichel et al. ............... 257/409 |

* cited by examiner

SUPERIOR INTEGRITY OF HIGH-K METAL GATE STACKS BY CAPPING STI REGIONS

BACKGROUND OF THE INVENTION

1. Field of the Invention

Generally, the present disclosure relates to the fabrication of highly sophisticated integrated circuits including advanced transistor elements that comprise gate structures of increased capacitance including a high-k gate dielectric material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of integrated circuits, field effect transistors represent one important type of circuit element that substantially determines performance of the integrated circuits. Generally, a plurality of process technologies are currently practiced for forming field effect transistors, wherein, for many types of complex circuitry, CMOS technology is one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the mobility of the charge carriers in the channel region.

The continuous shrinkage of critical dimensions of transistor elements has resulted in a gate length of field effect transistors of 50 nm and significantly less, thereby providing sophisticated semiconductor devices having enhanced performance and an increased packing density. The increase of electrical performance of the transistors is strongly correlated with a reduction of the channel length, which may result in an increased drive current and switching speed of the field effect transistors. On the other hand, the reduction of the channel length is associated with a plurality of issues in terms of channel controllability and static leakage currents of these transistors. It is well known that field effect transistors with a very short channel may require an increased capacitive coupling between the gate electrode structure and the channel region in order to provide the desired static and dynamic current flow controllability. Typically, the capacitive coupling is increased by reducing the thickness of the gate dielectric material, which is typically formed on the basis of a silicon dioxide-based material, possibly in combination with a nitrogen species, due to the superior characteristics of a silicon/silicon dioxide interface. Upon implementing a channel length of the above-identified order of magnitude, however, the thickness of the silicon dioxide-based gate dielectric material may reach values of 1.5 nm and less, which in turn may result in significant leakage currents due to a direct tunneling of the charge carriers through the very thin gate dielectric material. Since the exponential increase of the leakage currents upon further reducing the thickness of silicon dioxide-based gate dielectric materials is not compatible with the thermal power design requirements, other mechanisms have been developed so as to further enhance transistor performance and/or reduce the overall transistor dimensions.

For example, by creating a certain strain component in the channel region of silicon-based transistor elements, the charge carrier mobility and, thus, the overall conductivity of the channel may be enhanced. For a silicon material with a standard crystallographic configuration, i.e., a (100) surface orientation with the channel length direction oriented along a <110> equivalent direction, tensile strain in the current flow direction may enhance conductivity of electrons, thereby improving transistor performance of N-channel transistors. On the other hand, generating a compressive strain in the current flow direction may increase the mobility of holes and may, thus, provide superior conductivity in P-channel transistors. Consequently, a plurality of strain-inducing mechanisms have been developed in the past, which per se require a complex manufacturing sequence for implementing these techniques. Upon further device scaling, "internal" strain-inducing sources, such as an embedded strain-inducing semiconductor material, may represent a very efficient strain-inducing mechanism. For example, frequently, the incorporation of a compressive strain-inducing silicon/germanium alloy in the drain and source areas of P-channel transistors is applied in order to enhance performance of these transistors. For this purpose, in an early manufacturing stage, cavities are formed in the active region laterally adjacent to the gate electrode structure of the P-channel transistor, while the N-channel transistors are covered by a spacer layer. These cavities may be subsequently refilled with the silicon/germanium alloy on the basis of selective epitaxial growth techniques. During the etch process for forming the cavities and during the subsequent epitaxial growth process, the gate electrode of the P-channel transistor has to be encapsulated in order to not unduly expose sensitive materials of the gate electrode structure, such as a silicon-based electrode material, to the process ambient for forming the cavities and for selectively growing the silicon/germanium alloy. Thereafter, the gate electrode structures may be exposed and the further processing may be continued by forming drain and source regions in accordance with any appropriate process strategy.

Basically, the above-described strain-inducing mechanism is a very efficient concept for improving transistor performance of P-channel transistors, wherein the efficiency of the finally obtained strain in the channel region of the transistor, however, strongly depends on the internal strain level of the semiconductor alloy and on the lateral offset of this material from the channel region. Typically, the material composition of the strain-inducing semiconductor alloy is restricted by currently available sophisticated selective epitaxial deposition recipes, which, in the case of a silicon/germanium alloy, may presently not allow germanium concentrations of more than approximately 30 atomic percent. Consequently, a further improvement of the total strain in the channel region requires a reduction of the lateral offset of the silicon/germanium alloy from the channel region so that any protective spacer structures may have to be provided with a reduced width.

In addition to providing strain-inducing mechanisms in sophisticated field effect transistors, sophisticated gate electrode materials have also been proposed in order to overcome the restrictions of conventional silicon dioxide/polysilicon-based gate electrode structures. To this end, the conventional silicon dioxide-based gate dielectric material is replaced, at least partially, by a so-called high-k dielectric material, i.e., a dielectric material having a dielectric constant of 10.0 and higher, which may result in a desired high capacitance between the gate electrode and the channel region, while nevertheless a certain minimum physical thickness is provided so as to keep the resulting leakage currents at an acceptable level. For this purpose, a plurality of dielectric materials, such as hafnium oxid-based materials, zirconium oxide, aluminum oxide and the like, are available and may be used in sophisticated gate electrode structures. Furthermore, the polysilicon material may also be replaced, at least in the vicinity of the gate dielectric material, since typically polysilicon suffers from charge carrier depletion in the vicinity of the gate dielectric material, which may reduce the effective capacitance. Moreover, with sophisticated high-k gate dielectric materials, the work function of standard polysilicon materials and a corresponding doping may no longer be sufficient to provide the required electronic characteristics of the gate electrode material in order to obtain a desired threshold voltage of the transistors under consideration. For this reason, specific work function adjusting metal species, such as aluminum, lanthanum and the like, are typically incorporated in the gate dielectric material and/or in an appropriate electrode material in order to obtain a desired work function and also increase conductivity of the gate electrode material at least in the vicinity of the gate dielectric material.

Thus, a plurality of sophisticated process strategies have been developed, wherein, in some promising approaches, the sophisticated gate materials, such as a high-k dielectric material and a metal-containing electrode material, possibly including a work function adjusting metal species, may be provided in an early manufacturing stage in combination with a polysilicon material, thereby providing a high degree of compatibility with conventional process strategies for forming sophisticated field effect transistors. It turns out, however, that a reliable confinement of the sensitive material system including the high-k dielectric material and the metal-containing electrode material has to be guaranteed in order to avoid a shift in threshold voltage or any other variabilities of the sophisticated high-k metal gate electrode structures.

In an attempt to further enhance device performance of sophisticated field effect transistors, it has been proposed to combine sophisticated high-k metal gate electrode structures with a strain-inducing mechanism, for instance, by incorporating a strain-inducing semiconductor alloy in the active regions of the transistors. In this case, the encapsulation of the gate electrode structure of the transistor, which may require the incorporation of an embedded strain-inducing semiconductor alloy, may have to be implemented on the basis of detrimental requirements. On the one hand, the confinement of the gate electrode structure has to ensure integrity of the sensitive material system, for example, prior to, during and after the incorporation of the strain-inducing semiconductor material, and, on the other hand, a reduced thickness of any protective spacer elements, such as silicon nitride-based materials, is to be selected with reduced width in view of enhancing efficiency of the strain-inducing mechanism. Consequently, a compromise of thickness of the spacer elements and gain in performance of sophisticated transistors is typically applied.

In many conventional approaches, however, overall defectivity during the patterning of the sophisticated high-k metal gate electrode structures may require efficient wet chemical cleaning processes. For this purpose, an SPM (mixture of sulfuric acid and hydrogen peroxide) solution has proven to be a very efficient cleaning agent, which, however, "efficiently" removes metal-containing electrode materials, such as titanium nitride, as are provided in the sophisticated gate electrode structure. Omitting the cleaning step on the basis of SPM or providing a less efficient cleaning recipe may significantly increase the overall defectivity, thereby resulting in a significant yield loss. Using efficient SPM cleaning solutions, however, may result in significant gate failures in sophisticated semiconductor designs, as will be described in more detail with reference to FIGS. 1a-1f.

Figure 1A:
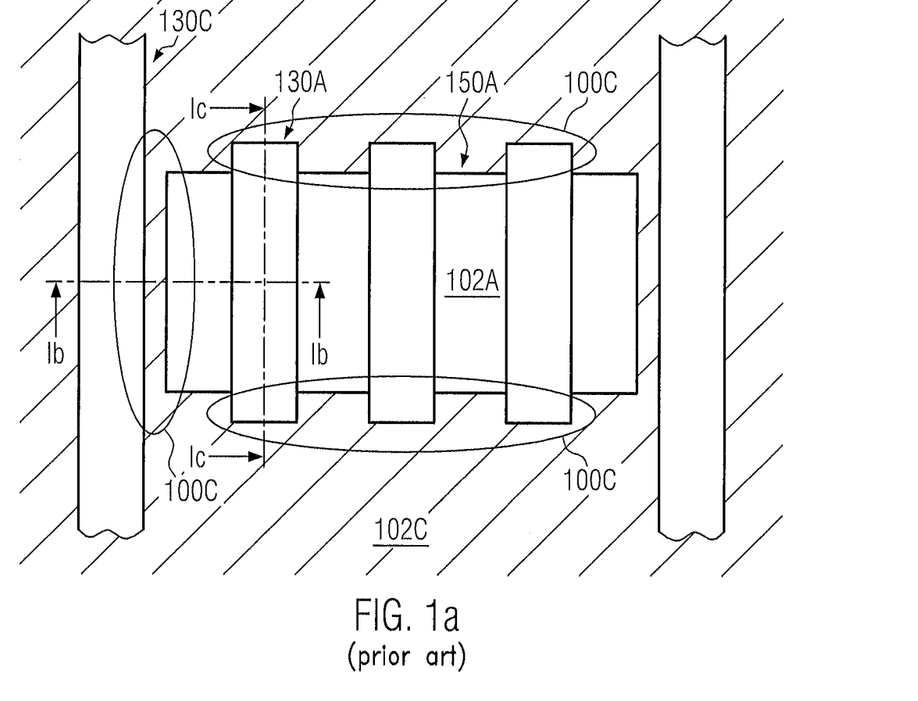
FIG. 1a schematically illustrates a top view of a semiconductor device comprising high-k metal gate electrode structures formed on the basis of a conventional process strategy.

FIG. 1a schematically illustrates a top view of a semiconductor device 100 according to a complex design. As shown, the device 100 or its design comprises an active region 102A, which is to be understood as a semiconductor region in which one or more transistors are to be formed. For example, the active region 102A is illustrated to comprise three transistors 150A including respective gate electrode structures 130A. The gate electrode structures 130A may include a complex material system including a high-k dielectric material and a metal-containing electrode material, as discussed above. Basically, the gate electrode structures 130A represent conductive lines extending across the active region 102A and are typically formed with an end portion thereof on an isolation region 102C, which laterally delineates the active region 102A and any other active regions (not shown). Moreover, according to design requirements, a gate electrode structure 130C may also extend above the isolation region 102C in close proximity to the active region 102A. It should be appreciated that a length of the gate electrode structures 130A, 130C may be 50 nm and less in sophisticated applications so that the distance between the gate electrode structure 130C and the active region 102A may be significantly less than the critical gate length. Furthermore, the transistors 150A may represent devices that require the incorporation of a strain-inducing semiconductor material, such as a silicon/germanium alloy, possibly in combination with a semiconductor alloy for appropriately adjusting the threshold voltage of the transistors 150A.

Consequently, upon forming the device 100 according to the geometric configuration as shown in FIG. 1a, a plurality of complex process steps are required for forming the isolation region 102C and the active region 102A, followed by a sophisticated patterning process for implementing the gate electrode structures 130A, 130C in combination with any processes for forming the semiconductor alloy as required for adjusting the threshold voltage of the transistors 150A. To this end, complex wet chemical cleaning recipes are typically applied, which may have a negative influence on the finally obtained device characteristics, which may even result in significant gate failures. For example, it has been observed that, in particular, the metal-containing electrode material of the sensitive material system in the gate electrode structures 130A, 130C is significantly damaged or missing, which may result in reduced performance or total failure of the corresponding transistor elements. For this reason, appropriate sidewall spacer structures or protective liners are provided immediately after patterning the gate electrode structures 130A, 130C in order to appropriately encapsulate the sensitive gate material system. Although this concept may significantly reduce the gate failures, nevertheless, advanced yield loss may occur, wherein it has been recognized that, in particular, critical areas 100C significantly contribute to any device failures. For example, one of the critical regions 100C is a gate electrode structure or gate line 130C that is positioned close to the active region 102A. Moreover, the end portions of the gate electrode structures 130A, which extend from the active region 102A into the isolation region 102C also represent critical zones in which inferior integrity of the sensitive gate materials is observed. It is believed that, in particular, a significant recessing of the isolation region 102C in the vicinity of the active region 102A contributes to a less efficient encapsulation of the gate electrode structures 130A, 130C, which may then result in significant yield loss during the further processing, as will be described in more detail with reference to FIGS. 1b-1f.

Figure 1B:
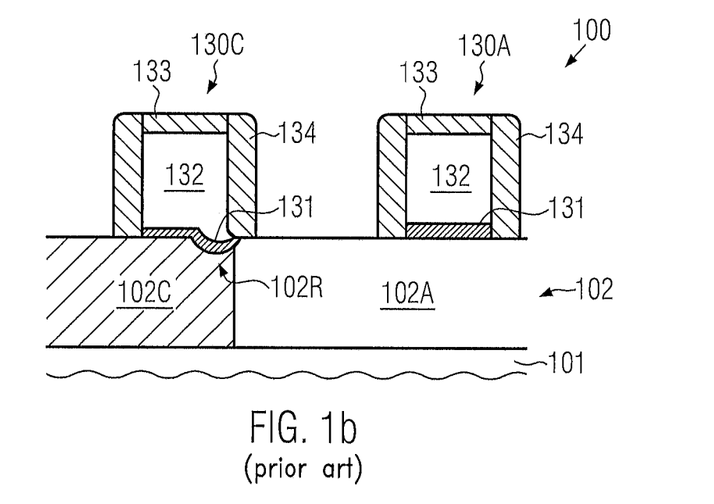

FIG. 1b schematically illustrates a cross-sectional view of a semiconductor device 100 according to the section indicated as Ib in FIG. 1a. As illustrated, the device 100 comprises a substrate 101 and a semiconductor layer 102, which is typically provided in the form of a silicon material. The substrate 101 and the semiconductor layer 102 may form a silicon-on-insulator (SOI) architecture when a buried insulating material (not shown) is formed below the semiconductor layer 102. In other cases, a bulk configuration may be formed by the semiconductor layer 102 and the substrate 101, when the semiconductor layer 102 is a portion of a crystalline semiconductor material of the substrate 101. The semiconductor layer 102 typically comprises a plurality of active regions, such as the active region 102A, which are laterally delineated by the isolation region 102C. The isolation region 102C is typically comprised of silicon dioxide and may have a pronounced recessing 102R that is positioned close to the active region 102A. Furthermore, the gate electrode structures 130A, 130C are formed on the active region 102A and the isolation region 102C, respectively, and comprise a material system 131, which is to be understood as a gate dielectric material including a high-k dielectric material, such as hafnium oxide and the like, in combination with a conventional dielectric material, such as silicon oxynitride and the like. Moreover, typically, the material system 131 comprises a metal-containing cap or electrode material, such as titanium nitride, which may also include appropriate metal species in order to obtain the desired work function, as is also discussed above. Thus, the material system 131 typically comprises a plurality of individual material layers, wherein the specific number and composition of the various material layers depend on device and process requirements. Furthermore, the gate electrode structures 130A, 130C comprise a further electrode material 132, for instance in the form of a silicon material, followed by a dielectric cap material 133, such as a silicon nitride material, a silicon dioxide material, or a combination thereof and the like. Furthermore, a liner or spacer 134, for instance comprised of silicon nitride, is formed on the sidewalls of the materials 132 and 131 in order that, in particular, any sensitive materials in the system 131 are appropriately protected.

Figure 1C:
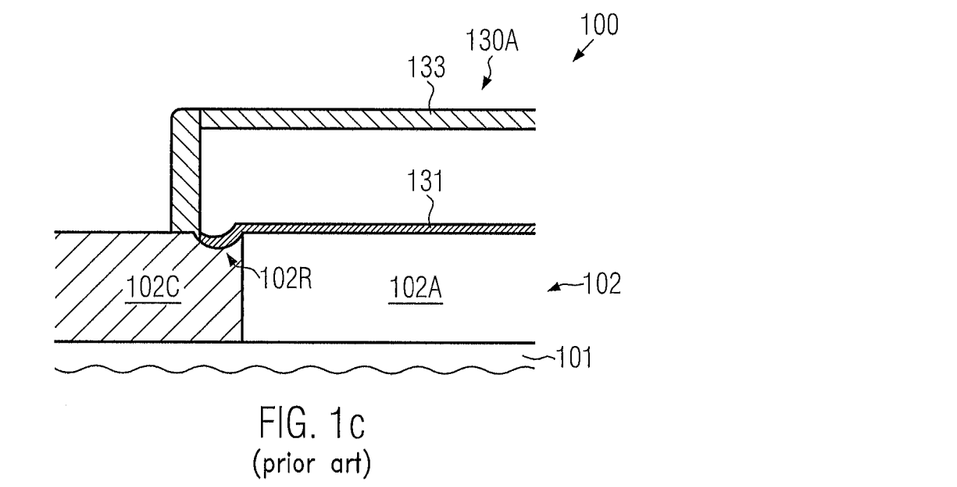

FIG. 1c schematically illustrates a cross-sectional view along the section Ic of FIG. 1a. Thus, as shown, the gate electrode structure 130A is formed above the active region 102A and extends with an end portion thereof into the isolation region 102C. Also in this area, the pronounced recess 102R is typically present and may have a significant influence on the final characteristics of the gate electrode structure 130A.

The semiconductor device 100 as shown in FIGS. 1b and 1c is formed on the basis of the following process techniques. The isolation region 102C is formed in the semiconductor layer 102 on the basis of well-established shallow trench isolation process techniques. Thereafter, appropriate masking regimes may be applied so as to incorporate a desired well dopant species in the various active regions, such as the active region 102A, thereby adjusting the basic transistor characteristics, such as conductivity type, threshold voltage and the like. As is well known, a plurality of cleaning processes may typically have to be applied which may result in a certain degree of material erosion in the isolation region 102C, wherein additional rework processes of the lithography processes may even further contribute to unwanted material erosion. Moreover, as discussed above, in some active regions, an additional semiconductor material (not shown) is frequently provided on the basis of selective epitaxial growth techniques, for instance for appropriately adjusting the threshold voltage of P-channel transistors, wherein the corresponding masking process in combination with the selective epitaxial growth techniques and the surface preparation processes associated therewith may result in a pronounced material loss in the isolation region 102C, in particular in the vicinity of the active region 102A when corresponding to a P-channel transistor. Thereafter, the further processing is continued by providing material layers for the system 131, possibly in combination with additional heat treatments so as to diffuse a work function adjusting metal species and the like. Finally, the material 132 and the cap material 133, possibly in combination with additional sacrificial materials, such as hard mask materials and the like, are deposited on the basis of appropriate process techniques. It should be appreciated that providing appropriate work function metals for P-channel transistors and N-channel transistors, respectively, may also involve respective patterning processes. Next, the complex layer stack is patterned by using sophisticated lithography and etch techniques followed by the deposition of a spacer layer or liner, which is subsequently patterned into the liner or spacer structure 134. To this end, various process strategies may be applied, wherein, in other device areas, the spacer or liner material may be patterned in a later manufacturing stage, while in other cases a dedicated liner material may be formed and patterned prior to depositing the spacer material which may be used for forming the structure 134.

Figure 1D:
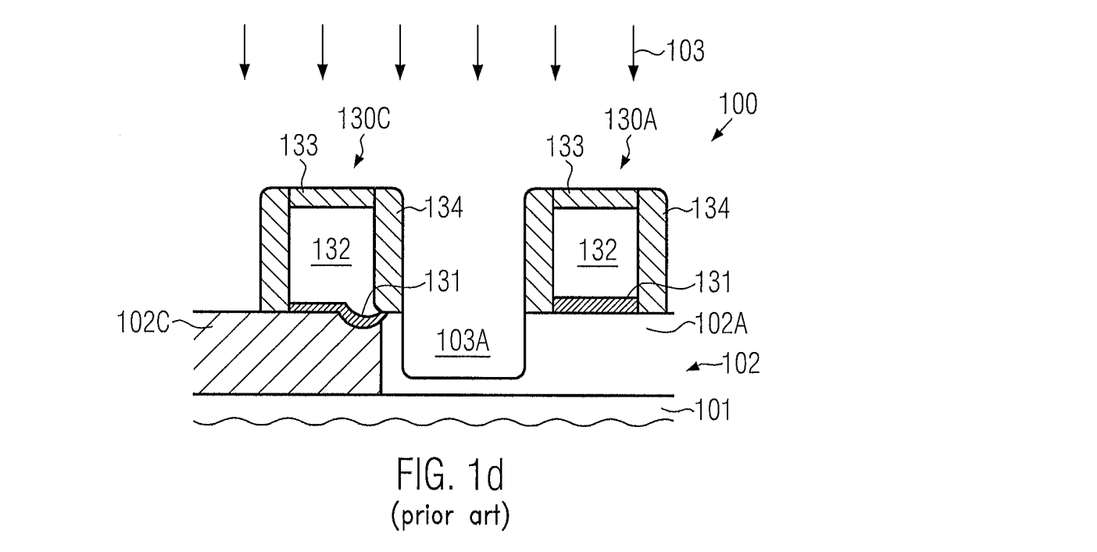
FIGS. 1d-1f schematically illustrate cross-sectional views of a conventional manufacturing sequence for forming an embedded strain-inducing semiconductor alloy, thereby causing significant gate failures, according to conventional strategies.
Figure 1E:
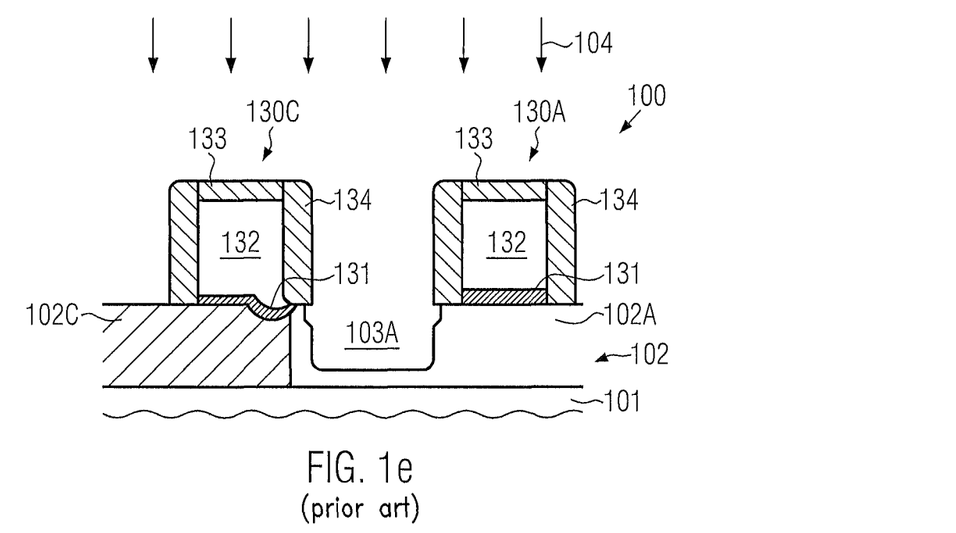
Figure 1F:
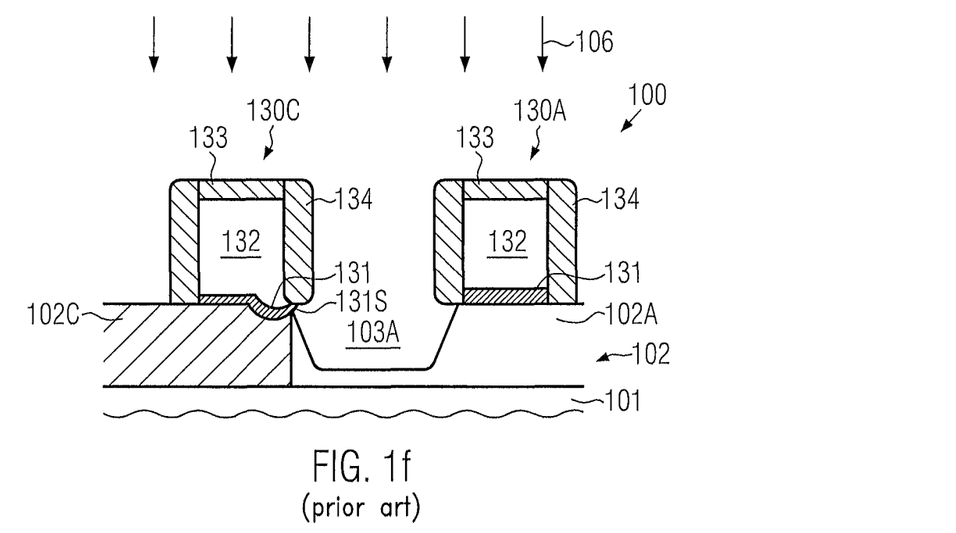

With reference to FIGS. 1d-1f, a process sequence will be described as an example for illustrating a failure mechanism, in which the encapsulation of the gate electrode structures, such as the gate electrode structure 130C (FIG. 1b), may be insufficient and may result in pronounced yield loss. It should be appreciated, however, that a similar exposure of sensitive gate materials may also occur at the end portions of the gate electrode structure 130A caused by the pronounced recessing 102R, as shown in FIG. 1c.

FIG. 1d schematically illustrates the device 100 during an etch process 103 for forming cavities 103A in the active region 102A adjacent to the isolation region 102C. As illustrated, the cap materials 133 and the liner 134 may act as an etch mask.

FIG. 1e schematically illustrates the device 100 during a cleaning process 104 in order to remove any etch byproducts and other contaminants, thereby, however, also contributing to a certain material erosion at exposed sidewall surface areas in the cavities 103A.

FIG. 1f schematically illustrates the semiconductor device 100 during a further cleaning process 106, which is typically performed prior to starting a selective epitaxial growth process in order to remove native oxides and the like. On the other hand, a certain degree of material erosion may occur in the cavities 103A so that a sidewall surface area 131S of the sensitive material system 131 may be exposed below the sidewall spacer structure 134 of the gate electrode structure 130C. Consequently, sensitive materials may be attacked and may be removed, depending on the cleaning or etch chemistry used. Furthermore, during the further processing, for instance upon epitaxially growing a strain-inducing semiconductor alloy in the cavities 103A, the sidewalls may not be efficiently covered, thereby even further contributing to material deterioration of the system 131 during the further processing.

Similarly, the recessed configuration of the isolation region 102C at or near the end portions of the gate electrode structure 130A (FIG. 1c) may also result in an exposure of any sensitive materials, thereby causing a significant shift of the overall material characteristics.

In view of the situation described above, the present disclosure relates to manufacturing techniques and semiconductor devices in which sophisticated high-k metal gate electrode structures may be formed in an early manufacturing stage, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which integrity of sensitive gate materials may be ensured with superior efficiency by reducing the degree of recessing of trench isolation regions in the vicinity of active regions. It has been recognized that, in particular, the recessed configuration of trench isolation regions in close proximity to active regions may significantly contribute to yield losses caused by gate failures or gate deterioration. According to the principles disclosed herein, a superior surface topography in isolation regions may be accomplished by providing an appropriate dielectric cap layer, which may result in superior resistivity with respect to a plurality of cleaning recipes, thereby significantly reducing undue material erosion prior to and during the complex manufacturing process for forming high-k metal gate electrode structures. Due to the superior surface topography at the vicinity of active regions, the encapsulation of the sensitive gate material may be preserved during the further processing, for instance upon forming the strain-inducing semiconductor alloy, at least for one type of transistor. Furthermore, the superior etch resistivity of the trench isolation region may also be used in generally improving the overall surface topography, for instance, any differences in height level between active regions of P-channel transistors and N-channel transistors, which may typically be created during the process sequence for selectively forming a threshold adjusting semiconductor alloy. For example, an appropriate adaptation of the height level of one type of active region may be applied without significantly affecting the surface topography of the trench isolation region in the vicinity of this active region due to the presence of the dielectric cap layer having the superior etch resistivity.

One illustrative method disclosed herein comprises forming a trench isolation region in a semiconductor layer of a semiconductor device by using a first dielectric fill material, wherein the trench isolation region laterally delineates an active region in the semiconductor layer. The method further comprises forming a cap layer on the first dielectric material by using a second dielectric material, wherein the first and second dielectric materials have a different material composition. Additionally, the method comprises forming a gate electrode structure on the active region and the trench isolation region, which includes the cap layer.

A further illustrative method disclosed herein comprises forming a trench isolation region in a semiconductor layer of a semiconductor device by recessing a first dielectric material of the trench isolation region and by forming a second dielectric material as a cap layer on the recessed first dielectric material. The method further comprises forming a gate electrode structure on the cap layer of the trench isolation region, wherein the gate electrode structure comprises a high-k dielectric material.

One illustrative semiconductor device disclosed herein comprises a trench isolation region that laterally delineates an active region in a semiconductor layer. The trench isolation region comprises a first dielectric material and a second dielectric material formed on the first dielectric material, wherein the first and second dielectric materials differ in their material composition. The semiconductor device further comprises a gate electrode structure formed on a channel area of the active region, wherein the gate electrode structure comprises a material system comprising a high-k dielectric material and a metal-containing electrode material. The gate electrode structure further comprises a protective liner formed on sidewalls of the high-k dielectric material and the metal-containing electrode material.

BRIEF DESCRIPTION OF THE DRAWINGS

The disclosure may be understood by reference to the following description taken in conjunction with the accompanying drawings, in which like reference numerals identify like elements, and in which:

FIGS. 1b-1c schematically illustrate cross-sectional views of the device of FIG. 1a;

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally addresses the problem of gate failures, which may occur in conventional strategies by forming high-k metal gate electrode structures in an early manufacturing stage. To this end, the surface topography of the trench isolation regions is significantly enhanced by providing an appropriate dielectric cap layer, which exhibits a significantly increased robustness with respect to a plurality of etch chemistries, such as reactive wet chemical cleaning recipes and the like, thereby significantly reducing or substantially avoiding undue material removal, in particular prior to the complex processes required, for example, for the provision of a threshold adjusting semiconductor alloy and the like. Due to the superior surface topography, the encapsulation of the sensitive gate materials may be preserved upon performing further complex manufacturing processes, such as the incorporation of a strain-inducing semiconductor material, the adaptation of height levels of active regions of P-channel transistors and N-channel transistors and the like. In particular, any gate failures caused by the presence of pronounced recessed areas of the trench isolation region adjacent to active regions may be significantly reduced, which thus contributes to superior production yield in a manufacturing process in which high-k metal gate electrode structures may be formed in an early manufacturing stage.

With reference to FIGS. 2a-2j, further illustrative embodiments will now be described in more detail, wherein reference may also be made to FIGS. 1a-1f.

Figure 2A:
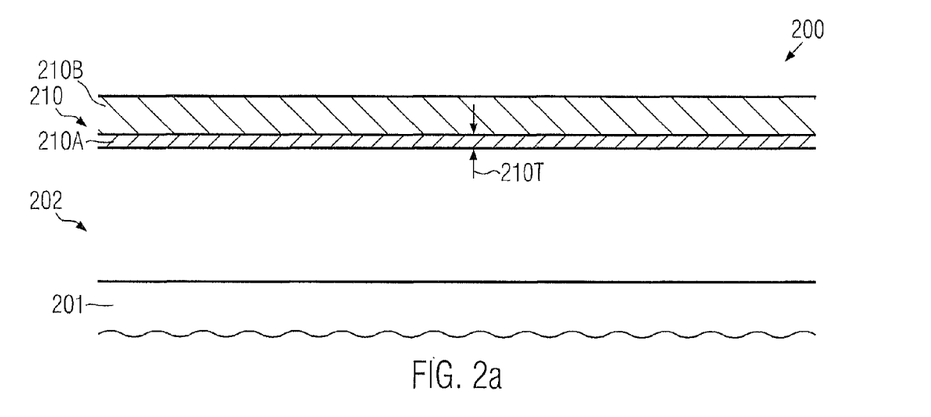
FIGS. 2a-2j schematically illustrate cross-sectional views of a semiconductor device during various manufacturing stages in forming high-k metal gate electrode structures on the basis of trench isolation regions having a superior surface topography by providing an additional dielectric cap layer, according to illustrative embodiments.

FIG. 2a schematically illustrates a cross-sectional view of a semiconductor device 200 in an early manufacturing stage. As shown, the device 200 may comprise a substrate 201, such as a semiconductor material or any other carrier material that is appropriate for forming thereon or thereabove a semiconductor layer 202. The substrate 201 and the semiconductor layer 202 may form an SOI configuration when a buried insulating material (not shown) may be provided below the semiconductor layer 202, while, in other cases, the semiconductor layer 202 may directly connect to a crystalline semiconductor material of the substrate 201 when a bulk configuration is considered. Furthermore, a hard mask layer 210 is formed above the semiconductor layer 202 and, in the embodiment shown, may comprise a first mask layer 210A, such as a silicon dioxide layer, followed by a second mask layer 210B, for instance provided in the form of a silicon nitride material. The layers 210A, 210B may be formed on the basis of any well-established process technique, for instance, by oxidation for the layer 210A, or deposition using thermally activated chemical vapor deposition (CVD) and the like. Similarly, the layer 210B may be deposited by any appropriate deposition technique. The first mask layer 210A may be provided with a thickness of approximately 10-25 nm so as to provide sufficient process margins during the further processing when forming a dielectric cap layer in trench isolation regions. Furthermore, the layer 210B may be provided with a thickness of approximately 60-100 nm, depending on the overall device requirements. Thus, it should be appreciated that the thickness 210T of the first mask layer 210A is typically greater than an oxide layer of semiconductor devices that may receive a conventional trench isolation region, as is, for instance, described above with reference to the semiconductor device 100.

Figure 2B:
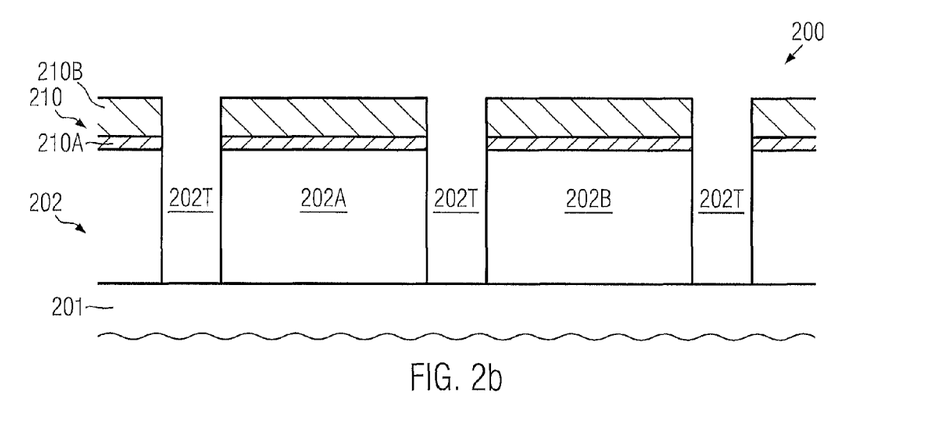

FIG. 2b schematically illustrates the device 200 in a further advanced manufacturing stage in which trenches 202T are formed so as to extend through the semiconductor layer 202, thereby laterally delineating a plurality of active regions, such as active regions 202A, 202B. To this end, the mask layer 210 may be appropriately patterned on the basis of a lithography process using a resist material in order to pattern the mask layer 210, which may then be used as a hard mask for etching into the semiconductor layer 202. To this end, any well-established anisotropic etch techniques may be applied, as are also used in conventional strategies.

Figure 2C:
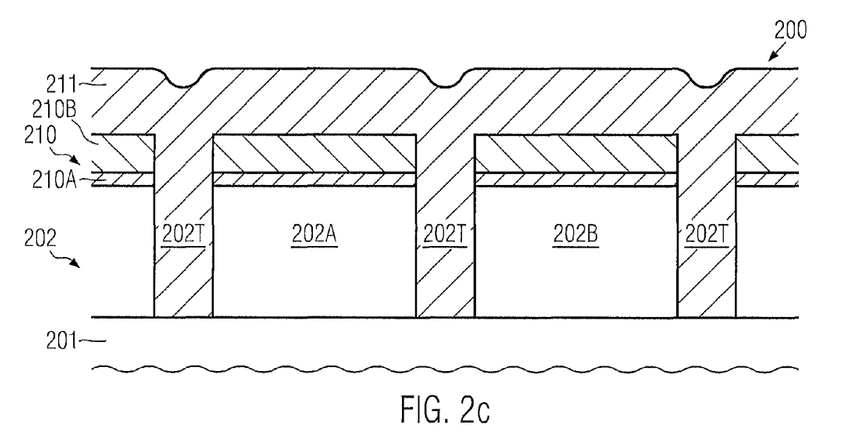

FIG. 2c schematically illustrates the device 200 with a first dielectric material 211 formed within the trenches 202T and above the mask layer 210. The material 211 may be formed on the basis of any appropriate technique, for instance by forming or depositing a liner material, such as a silicon dioxide liner material, which may be accomplished by oxidation and/or deposition using thermally activated CVD techniques and the like. Thereafter, a further silicon dioxide material may be deposited by applying high density plasma deposition recipes, thereby substantially void-free filling the trenches 202T.

Figure 2D:
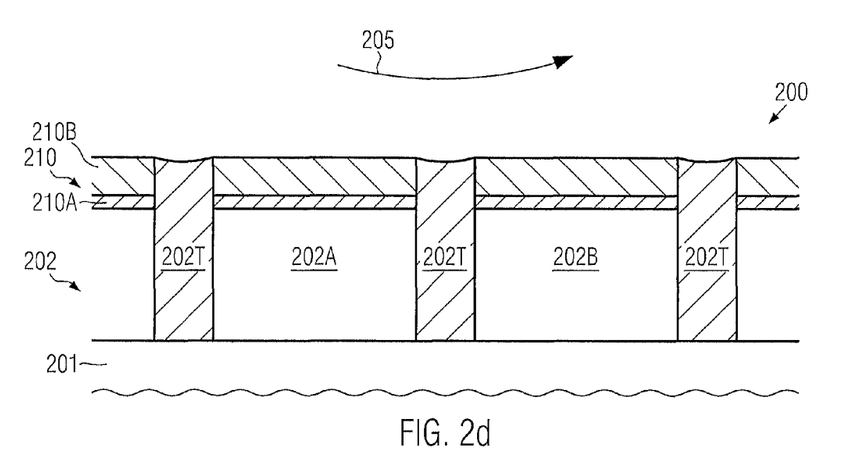

FIG. 2d schematically illustrates the device 200 during a material removal process 205, which may be applied as a chemical mechanical planarization or polishing process using appropriate etch recipes for removing a silicon dioxide material selectively with respect to the mask layer 210B. Consequently, similarly as in conventional STI (shallow trench isolation) process techniques, the silicon nitride material of the layer 210B may be used as a CMP stop material.

Figure 2E:
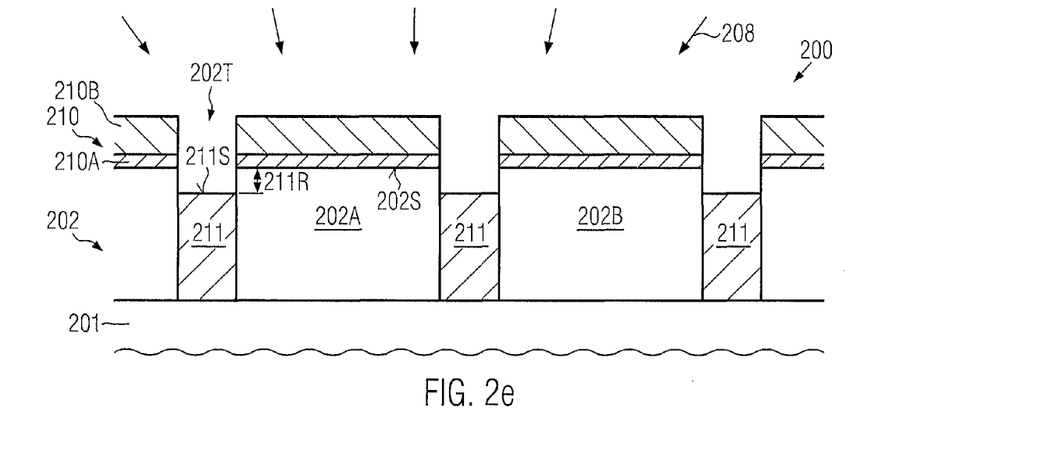

FIG. 2e schematically illustrates the device 200 when exposed to a reactive etch atmosphere 208, which may be selected such that the material 211 may be preferably removed with respect to the mask material 210B and also selectively with respect to the material of the active regions 202A, 202B. To this end, a plurality of highly selective etch recipes are available, for instance based on hydrofluoric acid (HF) and the like. It should be appreciated that a certain degree of "under etching" of the layer 210B, for instance by removing material of the layer 210A, may be less critical since a corresponding material erosion in the layer 210A may be efficiently compensated for during the further processing. During the etch process 208, a desired degree of recessing, indicated as 211R, of a surface 211S of the dielectric material 211 with respect to a surface 202S of the active regions 202A, 202B may be adjusted. For example, the degree of recessing 211R may be adjusted to approximately 5-50 nm, depending on the etch resistivity of a further dielectric material to be filled into the trench 202T in a later manufacturing stage.

Figure 2F:
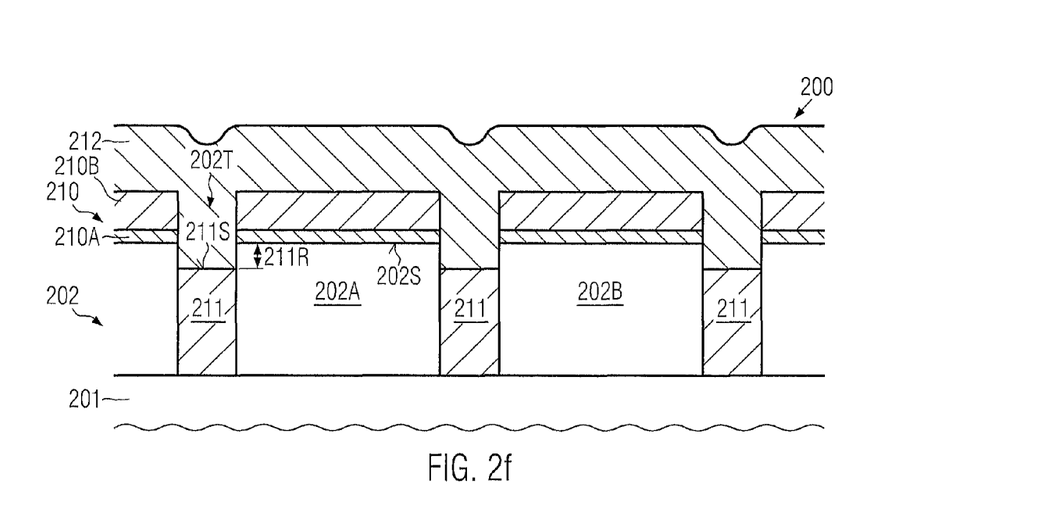

FIG. 2f schematically illustrates the semiconductor device 200 with a second dielectric material 212 formed above the mask layer 210B and on the first dielectric material 211, thereby refilling the isolation trenches 202T. In some illustrative embodiments, the dielectric material 212 may be provided in the form of a silicon and nitrogen-containing dielectric material which may be deposited on the basis of high density plasma CVD or on the basis of low pressure CVD using well-established deposition recipes for silicon nitride material. Prior to or after the deposition of the material 212, the dielectric material 211 may be densified by performing an anneal process, for instance after the deposition of the material 211 (FIG. 2c) so that the materials 211 and 212, in combination, reliably fill the isolation trenches 202T and provide the required dielectric and mechanical characteristics, while additionally the material 212 may provide superior etch resistivity with respect to a plurality of wet chemical etch chemistries, such as hydrofluoric acid and the like.

In other illustrative embodiments, the material 212 may be provided in the form of any other dielectric material having a high etch selectivity with respect to the silicon dioxide material, i.e., the material 211, amorphous carbon material may be deposited on the basis of well-established CVD techniques.

Figure 2G:
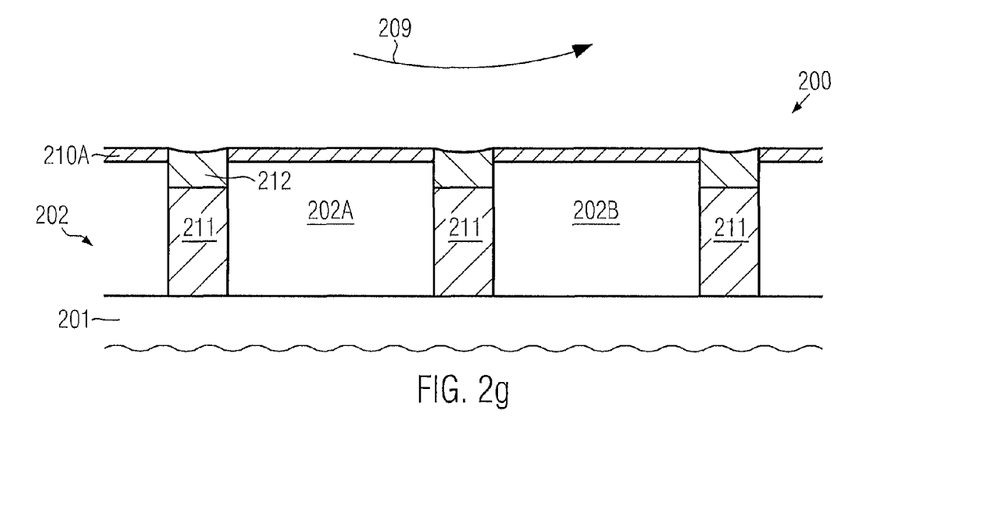

FIG. 2g schematically illustrates the device 200 during a further material removal process 209, such as a planarization process using well-established process recipes for, for instance, removing silicon nitride material, wherein the layer 210A may be used as a stop material. In other illustrative embodiments, the removal process 209 may be controlled on the basis of appropriately selecting the polish time in order to substantially expose the layer 210A. In still other illustrative embodiments (not shown), the mask layer 210 (FIG. 2a) may be formed so as to include a thin dedicated stop layer, for instance in the form of hafnium oxide and the like, which may be provided between the layers 210A, 210B of FIG. 2a. For example, a layer thickness of 2-10 nm may be selected for a corresponding stop layer, which may then be used for more efficiently controlling the removal process 209. It should be appreciated that hafnium oxide is a well-established material which may also be used as an efficient high-k dielectric material during the further processing of the device 200.

Figure 2H:
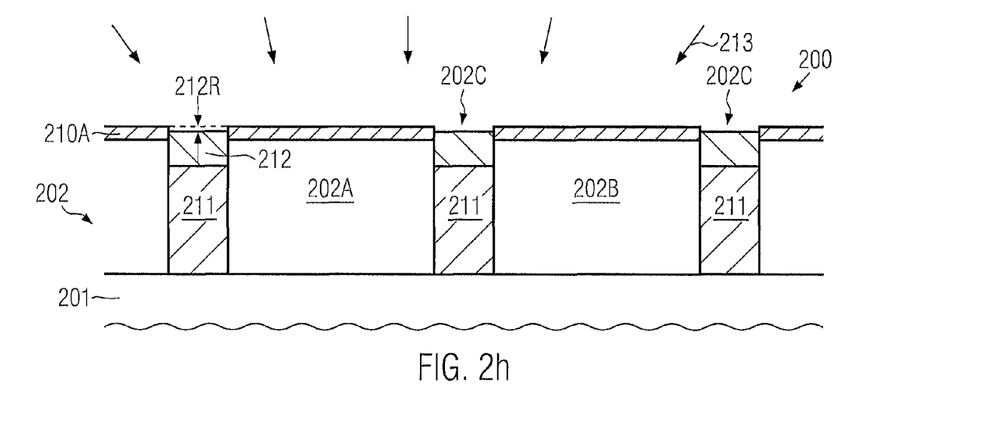

FIG. 2h schematically illustrates the device 200 during a further etch process 213 in which the height level of trench isolation regions 202C, comprised of the materials 211 and 212, may be reduced as, for instance, indicated by 212R, which may be accomplished on the basis of any appropriate etch chemistry, such as a mixture of hydrofluoric acid and ethylene glycol (HFEG) or based on any other appropriate etch chemistry, which exhibits a high degree of selectivity with respect to silicon material. In this case, the height level may be reduced without affecting the active regions 202A, 202B. It should be appreciated that the material of the layer 210A may also be removed to a certain degree, depending on the selectivity of the etch chemistry of the process 213. It should be further appreciated that, if required, any further control material, such as hafnium oxide and the like, may be removed prior to, during or after the process 213, while using the remaining portion of the mask layer 210A as an appropriate etch protection layer.

Figure 2I:
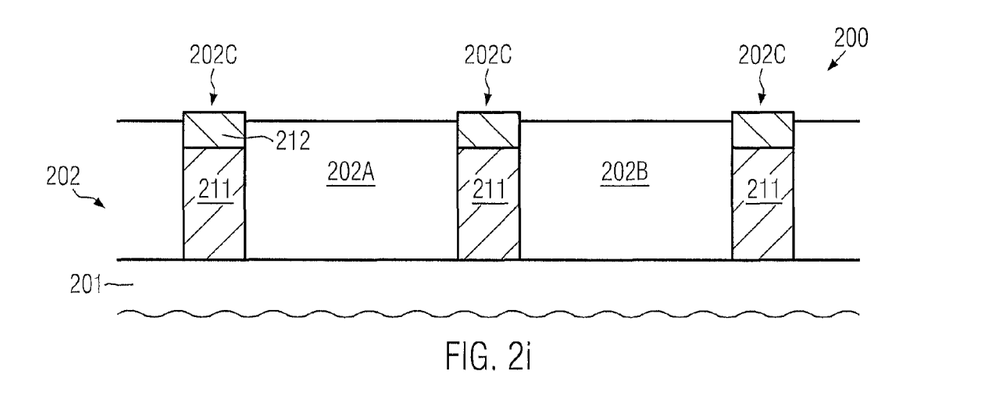

FIG. 2i schematically illustrates the device 200 after the removal of the mask layer 210A (FIG. 2h). The removal may be accomplished by using well-established wet chemical etch recipes, for instance by applying HF, wherein the cap layer 212 in the isolation regions 202C may substantially preserve the previously established surface topography thereof.

Consequently, the further processing may be continued on the basis of the isolation regions 202C having the desired surface topography, wherein the dielectric cap layer 212 may provide superior robustness during any cleaning recipes, which typically include reactive agents that may efficiently remove any silicon oxide-based materials. For example, in some process strategies, a threshold adjusting semiconductor material may be selectively formed on one type of active region, for instance in the active region 202A, while other active regions, such as the active region 202B, may be appropriately covered. To this end, well-established masking regimes and selective epitaxial growth techniques in combination with appropriate cleaning recipes may be applied, wherein the dielectric cap layer 212 may significantly reduce undue recessing of any non-masked areas of the isolation regions 202C. For a further adaptation of the overall surface topography caused by a non-symmetric process history with respect to the active regions 202A, 202B, a selective removal of material of the cap layers 212 in previously masked areas may be applied by using a resist mask and applying an appropriate etch chemistry for removing a portion of the dielectric cap layer 212. In other cases, a difference in height levels of the active region 202A, which may receive the threshold adjusting semiconductor alloy, and the active region 202B, which may not receive a corresponding semiconductor alloy, may be accomplished by recessing the active region 202A and re-growing the semiconductor alloy within the recess, wherein the degree of recessing and/or the thickness of the semiconductor alloy may be appropriately selected so as to obtain a desired height level.

In still other embodiments, as also discussed above with reference to the semiconductor device 100, after patterning the sophisticated high-k metal gate electrode structure, a strain-inducing semiconductor alloy may be formed, wherein also the superior robustness of the dielectric cap layer 212 may significantly reduce the probability of exposing sensitive gate materials.

Figure 2J:
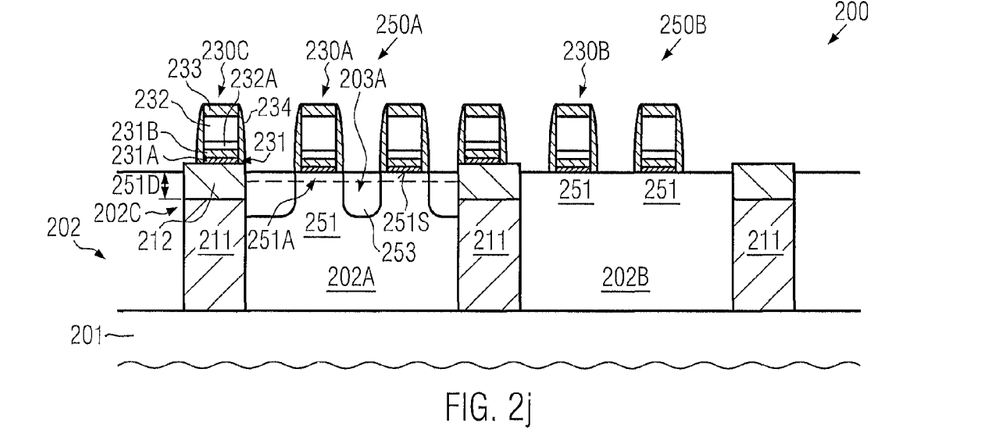

FIG. 2j schematically illustrates the semiconductor device 200 in a further advanced manufacturing stage. As shown, gate electrode structures 230A of transistors 250A may be formed on the active region 202A and gate electrode structures 230B of transistors 250B may be formed on the active region 202B. It should be appreciated that, as illustrated in FIG. 1a, the gate electrode structures 230A, 230B may also extend with respective end portions above the isolation region 202C, depending on the overall layout requirements. Furthermore, a gate electrode structure 230C may be formed on the isolation region 202C in close proximity to the active region 202A. The gate electrode structures 230A, 230B, 230C may comprise a material system 231 acting as a gate insulation layer and may comprise a high-k dielectric material 231B, possibly in combination with a conventional gate dielectric material 231A, such as silicon dioxide, silicon oxynitride and the like. Moreover, a metal-containing electrode material 232A may be formed on the gate insulation layer 231 and may be comprised of titanium nitride, tantalum, tantalum nitride and the like. Furthermore, a semiconductor-based electrode material 232 may be provided. The materials 232, 232A and the gate insulation layer 231 may be encapsulated by a liner or sidewall spacer 234 and a dielectric cap layer 233 may be provided. It should be appreciated that, for example, the gate electrode structures 230A may differ from the gate electrode structures 230B with respect to a work function adjusting metal species and the like, when the transistors 250A, 250B represent different types of transistors, such as P-channel transistors and N-channel transistors, respectively. Moreover, the gate electrode structures 230A, 230B, 230C may be provided with a gate length of 50 nm and less in sophisticated applications.

Furthermore, in the active region 202A, a threshold voltage adjusting semiconductor alloy, such as a silicon/germanium alloy 251A may be provided so as to act as a portion of a channel area 251, which thus forms an interface 251S with the corresponding gate insulation layers 231. Consequently, as discussed above, due to the presence of the dielectric cap layer 212 in the isolation regions 202C, in addition to a superior surface topography of the isolation regions 202C, a height level of the dielectric material 211 may be less than a height level defined by the interface 251S, as is indicated by the difference in height levels 251D.

Furthermore, in some illustrative embodiments, as shown, cavities 203A may be filled or overfilled with an appropriate strain-inducing semiconductor material 253, such as a silicon/germanium alloy, a silicon/tin alloy, a silicon/germanium/tin alloy, a silicon/carbon alloy and the like. On the other hand, the materials 253 and 251A may not be present in the active region 202B, depending on the overall device requirements.

The semiconductor device 200 as shown in FIG. 2j may be formed on the basis of process techniques described above and also described with reference to the semiconductor device 100. That is, after forming the isolation regions 202C having the superior surface topography due to the dielectric cap layer 212, the further processing may be continued by incorporating appropriate well dopant species into the active regions 202A, 202B, wherein additional rework processes may not negatively affect the finally obtained surface topography of the regions 202C. Thereafter, if required, the material 251A may be incorporated into the active region 202A, while the active region 202B may be masked, for instance, by an oxide hard mask material and the like. As discussed above, the region 202A may be recessed prior to growing the material 251A in order to obtain a desired surface leveling with respect to the active region 202B. Next, the gate electrode structures 230A, 230B, 230C may be formed on the basis of process techniques as described above with reference to the device 100. During this process of forming the gate electrode structures 230A, 230B, 230C, the liner or spacer 234 may be formed so as to reliably confine the sensitive gate materials 231, 232A. Due to the robustness of the dielectric cap layer 212, pronounced recess portions, such as the portions 102R (see FIGS. 1b-1f), may be avoided or at least significantly reduced, thereby also increasing integrity of the liner 234 and thus of the sensitive materials 231, 232A.

As a result, the present disclosure provides manufacturing techniques and semiconductor devices in which the encapsulation of sophisticated high-k metal gate electrode structures may be improved by reducing the surface topography of trench isolation regions. To this end, after filling the isolation trenches with an appropriate dielectric material, this material is recessed and an appropriate second dielectric material is provided, which has higher etch resistivity with respect to a plurality of cleaning recipes. In this manner, increased production yield may be obtained for process techniques in which high-k metal gate electrode structures are to be provided in an early manufacturing stage.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a dual layer patterned hard mask layer comprised of a first mask layer formed on a surface of a semiconductor layer and a second mask layer formed on said first mask layer;
    forming a trench through said dual layer patterned hard mask layer and into said semiconductor layer;
    forming a trench isolation region in said semiconductor layer of a semiconductor device by using a first dielectric material, said trench isolation region laterally delineating an active region in said semiconductor layer;
    with said dual layer patterned hard mask in position, including said second mask layer, forming a cap layer on the trench isolation region comprised of said first dielectric material by overfilling said trench with a second dielectric material, said first and second dielectric materials having different material composition;
    removing said second hard mask layer while leaving said first hard mask layer positioned on said surface of said semiconductor layer;
    with said first hard mask layer in position, performing a recess etching process on said cap layer comprised of said second dielectric material so as to thereby define a recessed cap layer having an upper surface that is positioned at a level that is below an upper surface of said first hard mask layer;
    completely removing said first hard mask layer so as to thereby expose said surface of said semiconductor layer; and
    after completely removing said first hard mask layer, forming a gate electrode structure on said active region and said cap layer.

2. The method of claim 1, wherein forming said gate electrode structure comprises forming a gate insulation layer so as to include a high-k dielectric material and forming a metal-containing electrode material above said gate insulation layer.

3. The method of claim 2, wherein forming said gate electrode structure further comprises forming a protective liner on sidewalls of said gate insulation layer and said metal-containing electrode material.

4. The method of claim 1, wherein, prior to forming said cap layer, the method comprises recessing said first dielectric material and forming said second dielectric material on said recessed first dielectric material.

5. The method of claim 4, wherein recessing said first dielectric material comprises adjusting a height level of said first dielectric material so as to be below a height level of the surface of said semiconductor layer.

6. The method of claim 1, further comprising forming a semiconductor alloy on said active region prior to forming said gate electrode structure.

7. The method of claim 6, wherein forming said semiconductor alloy comprises recessing said active region and selectively depositing said semiconductor alloy in said recess.

8. The method of claim 1, further comprising forming a cavity in said active region in the presence of said gate electrode structure and forming a strain-inducing semiconductor material in said cavity.

9. The method of claim 8, wherein said strain-inducing semiconductor material comprises at least one of germanium, tin and carbon.

10. A method, comprising:
    forming a dual layer patterned hard mask layer comprised of a first mask layer formed on a surface of a semiconductor layer and a second mask layer formed on said first mask layer;

forming a trench through said dual layer patterned hard mask layer and into said semiconductor layer;

forming a trench isolation region comprised of a first dielectric material in said semiconductor layer of a semiconductor device, said trench isolation region having an upper surface that is positioned at a level that is below said surface of said semiconductor layer;

forming a second dielectric material as a cap layer on said upper surface of said trench isolation region, wherein said first and second dielectric materials have different material compositions, said cap layer being formed by:
overfilling said trench with said second dielectric material; and
performing a chemical mechanical polishing process that removes portions of said second dielectric material and said second hard mask layer and stops on said first hard mask layer thereby leaving said first hard mask layer positioned on said surface of said semiconductor layer; and forming a gate electrode structure on said active region and said cap layer, said gate electrode structure comprising a high-k dielectric material.

11. The method of claim 10, wherein forming the trench isolation region comprises overfilling the trench with the first dielectric material, performing a chemical mechanical polishing process on the first dielectric material that stops on the second hard mask layer, and performing a recess etching process on the first dielectric material to recess said first dielectric material such that the upper surface of the trench isolation region is positioned at the level that is below the upper surface of the semiconductor layer.

12. The method of claim 10, wherein the second dielectric material comprises a silicon and nitrogen-containing layer.

13. The method of claim 10, further comprising, prior to forming said gate electrode structure, forming a semiconductor alloy on an active region that is laterally delineated in said semiconductor layer by said trench isolation region.

14. The method of claim 11, wherein forming said gate electrode structure comprises forming a layer stack comprising a gate insulation layer including said high-k dielectric material and a metal-containing electrode material above said gate insulation layer, patterning said layer stack and forming a protective liner on sidewalls of said patterned layer stack.

15. The method of claim 14, further comprising forming cavities in an active region that is laterally delineated in said semiconductor layer by said trench isolation region and forming a strain-inducing semiconductor alloy in said cavities.

16. The method of claim 10, wherein said first mask layer comprises a silicon oxide material and has a thickness of approximately 10 nm or more.

17. The method of claim 1, wherein said first mask layer comprises silicon dioxide and said second mask layer comprises silicon nitride.

18. The method of claim 10, wherein said first mask layer comprises silicon dioxide and said second mask layer comprises silicon nitride.

19. A method, comprising:
forming a dual layer patterned hard mask layer comprised of a first mask layer formed on a surface of a semiconductor layer and a second mask layer formed on said first mask layer;

forming a trench through said dual layer patterned hard mask layer and into said semiconductor layer;

forming a trench isolation region comprised of a first dielectric material in said semiconductor layer of a semiconductor device, said trench isolation region having an upper surface that is positioned at a level that is below an upper surface of said semiconductor layer;

forming a second dielectric material as a cap layer on said upper surface of said trench isolation region, wherein said first and second dielectric materials have different material compositions, said cap layer being formed by:
overfilling said trench with said second dielectric material; and
performing a chemical mechanical polishing process that removes portions of said second dielectric material and said second hard mask layer and stops on said first hard mask layer thereby leaving said first hard mask layer positioned on said surface of said semiconductor layer;

with said first hard mask layer in position on said surface of said semiconductor layer, performing a second dielectric material recess etching process on said cap layer such that, after said second dielectric material recess etching process is completed, an upper surface of the recessed cap layer is positioned at a level that is below an upper surface of said first hard mask layer and above an upper surface of said semiconductor layer;

completely removing said first hard mask layer so as to thereby expose said surface of said semiconductor layer, and after completely removing said first hard mask layer, forming a gate electrode structure on said active region and said recessed cap layer.

20. The method of claim 19, wherein said first mask layer comprises silicon dioxide and said second mask layer comprises silicon nitride.

21. The method of claim 19, wherein forming said trench isolation region comprises overfilling said trench with said first dielectric material, performing a chemical mechanical polishing process on said first dielectric material that stops on said second hard mask layer, and performing a first dielectric recess etching process on said first dielectric material.

22. The method of claim 10, further comprising, after performing said chemical mechanical polishing process, and with said first hard mask layer positioned on said surface of said semiconductor layer, performing a recess etching process on said cap layer comprised of said second dielectric material so as to thereby define a recessed cap layer having an upper surface that is positioned at a level that is below an upper surface of said first hard mask layer.

* * * * *